US010236255B2

(12) United States Patent
Li et al.

(10) Patent No.: US 10,236,255 B2
(45) Date of Patent: Mar. 19, 2019

(54) CONTACT HAVING SELF-ALIGNED AIR GAP SPACERS

(71) Applicant: International Business Machines Corporation, Armonk, NY (US)

(72) Inventors: Juntao Li, Cohoes, NY (US); Junli Wang, Slingerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/645,688

(22) Filed: Jul. 10, 2017

(65) Prior Publication Data
US 2018/0082951 A1 Mar. 22, 2018

Related U.S. Application Data

(62) Division of application No. 15/269,247, filed on Sep. 19, 2016, now Pat. No. 9,768,118.

(51) Int. Cl.
| H01L 23/48 | (2006.01) |
| H01L 23/528 | (2006.01) |
| H01L 23/532 | (2006.01) |
| H01L 21/768 | (2006.01) |
| H01L 21/311 | (2006.01) |
| H01L 21/764 | (2006.01) |

(Continued)

(52) U.S. Cl.
CPC .... *H01L 23/5283* (2013.01); *H01L 21/31111* (2013.01); *H01L 21/764* (2013.01); *H01L 21/76843* (2013.01); *H01L 21/76879* (2013.01); *H01L 23/485* (2013.01); *H01L 23/5222* (2013.01); *H01L 23/5329* (2013.01); *H01L 23/53266* (2013.01); *H01L 23/53295* (2013.01)

(58) Field of Classification Search
CPC ......... H01L 21/76826; H01L 21/31633; H01L 21/76835; H01L 21/764; H01L 21/76807; H01L 21/31116; H01L 2924/0002; H01L 21/76831; H01L 23/53295; H01L 23/5222
See application file for complete search history.

(56) References Cited

U.S. PATENT DOCUMENTS 9,735,047 B1 * 8/2017 Chang ................. H01L 21/7682
2001/0054764 A1 * 12/2001 Nitta ................. H01L 21/32134
257/750

(Continued)

OTHER PUBLICATIONS

Li, et al., "Contact Having Self-Aligned Air Gap Spacers", U.S. Appl. No. 15/269,247, filed Sep. 19, 2016.

(Continued)

*Primary Examiner* — Changhyun Yu
(74) *Attorney, Agent, or Firm* — Cantor Colburn LLP; Vazken Alexanian

(57) ABSTRACT

A semiconductor device includes a semiconductor substrate, and a dielectric layer on an upper surface of the semiconductor substrate. A contact stack is formed in the dielectric layer. The contact stack includes an electrically conductive contact element, and a contact liner on first and second opposing sidewalls of the contact element. A first air gap is interposed between the dielectric layer and the contact liner on the first side wall, and a second air gap interposed between the dielectric layer and the contact liner on the second side wall.

15 Claims, 19 Drawing Sheets

(51) Int. Cl.
*H01L 23/485* (2006.01)
*H01L 23/522* (2006.01)

(56) References Cited

U.S. PATENT DOCUMENTS

| | | | | |
|---|---|---|---|---|
| 2005/0074961 A1* | 4/2005 | Beyer | ................... | H01L 21/764 438/619 |
| 2014/0117420 A1* | 5/2014 | Chen | ..................... | H01L 23/485 257/288 |

OTHER PUBLICATIONS

List of IBM Patents or Patent Applications Treated as Related; Aug. 17, 2017, 2 pages.

* cited by examiner

CONTACT HAVING SELF-ALIGNED AIR GAP SPACERS

DOMESTIC PRIORITY

This application is a divisional of U.S. patent application Ser. No. 15/269,247, filed Sep. 19, 2016, the disclosure of which is incorporated by reference herein in its entirety.

BACKGROUND

The present invention relates to semiconductor devices and, more particularly, to contact structures included in semiconductor devices.

Semiconductor devices such as field effect transistors (FETs), for example, typically include metal contacts. The close proximity of a metal gate contact to the one or more of the source/drain (S/D) metal contacts can induce a parasitic capacitance effect. As demands for semiconductor devices with reduced footprints continue, the contact gate pitch is further scaled to reduced dimensions, which increase the parasitic capacitance between the gate contact and the S/D contacts.

SUMMARY

According to a non-limiting embodiment of the invention, a method of forming a semiconductor device including a contact structure having self-aligned air gap spacers comprises depositing a dielectric layer on an upper surface of a semiconductor substrate. The method further includes forming a contact stack in the dielectric layer. The contact stack includes an electrically conductive contact element interposed between an opposing pair of layered contact liners. The layered contact liners include a sacrificial portion and a preservation portion. The method further includes removing the sacrificial portion while maintaining the preservation portion to form a self-aligned air gap between the dielectric layer and each preservation portion of the contact stack.

According to another non-limiting embodiment of the invention, a method of forming a fin-type field effect transistor (finFET) including a contact structure having self-aligned air gap spacers comprises depositing a dielectric layer on an upper surface of a semiconductor fin, and forming first and second contact stacks in the dielectric layer. The method further includes forming in the dialectic layer a gate stack between first and second contact stacks. The first and second contact stacks each include a contact element formed between an opposing pair of layered contact liners that comprise a sacrificial portion and a preservation portion. The method further includes removing the sacrificial portion while maintaining the preservation portion to form a self-aligned air gap between the gate stack and each preservation portion.

According to yet another non-limiting embodiment of the invention, a semiconductor device includes a semiconductor substrate, and a dielectric layer on an upper surface of the semiconductor substrate. A contact stack is formed in the dielectric layer. The contact stack includes an electrically conductive contact element, and a contact liner on first and second opposing sidewalls of the contact element. A first air gap is interposed between the dielectric layer and the contact liner on the first side wall, and a second air gap interposed between the dielectric layer and the contact liner on the second side wall.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 1-10 are a series of views illustrating a method of forming a contact structure having self-aligned air gap spacers, in which:

FIG. 1 is a cross-sectional view of a starting semiconductor substrate including a dielectric layer formed on an upper surface of an active semiconductor layer;

FIG. 2 illustrates the semiconductor substrate after patterning a hardmask layer formed on an upper surface of the dielectric layer;

FIG. 3 illustrates the semiconductor substrate following an etching process to extend the pattern of the hardmask into the dielectric layer so as to form one or more trenches;

FIG. 4 illustrates the semiconductor substrate undergoing a nitridation process to form a sacrificial film on an upper surface of the dielectric layer, the sidewalls of the trenches, and an upper surface of the semiconductor substrate exposed by a respective trench;

FIG. 5 illustrates the semiconductor substrate after removing a portion of the sacrificial film from the upper surface of the dielectric layer and exposed semiconductor substrate;

FIG. 6 illustrates the semiconductor substrate following deposition of a contact liner against the outer surface of the sacrificial film and on an upper surface of the active semiconductor layer;

FIG. 7 illustrates the semiconductor device after filing the trenches with a contact material to form a contact stack;

FIG. 8 illustrates the semiconductor device following a selective etching process that removes the sacrificial film while maintaining the contact liner to form air gaps between the contact stacks and the dielectric layer;

FIG. 9 illustrates a completed semiconductor device including a plurality of contact stacks separated from one another by a dielectric layer portion, and having air gaps between each contact stack a the dielectric layer portion; and FIG. 10 illustrates the semiconductor device following an optional etching process to increase the width of the air gaps.

FIGS. 11A-20 are a series of views illustrating a method of forming a semiconductor device including a contact structure having self-aligned air gap spacers, in which:

FIG. 11A illustrates a perspective view of a semiconductor device including a semiconductor fin formed atop a semiconductor substrate, and a gate stack that wraps around outer surfaces of the semiconductor fin;

FIG. 12 illustrates the semiconductor device of FIG. 11B following deposition of a dielectric layer that surrounds the gate stack;

FIG. 13 illustrates the semiconductor device of FIG. 12 after patterning a hardmask layer formed on an upper surface of the dielectric layer;

FIG. 14 illustrates the semiconductor device of FIG. 13 following an etching process to extend the pattern of the hardmask into the dielectric layer so as to form one or more trenches;

FIG. 15 illustrates the semiconductor device of FIG. 14 following a nitridation process to form a sacrificial film on an upper surface and sidewalls of the dielectric layer, sidewalls of gate spacers, and an upper surface of the semiconductor fin exposed by a respective trench;

FIG. 16 illustrates the semiconductor device of FIG. 15 after removing a portion of the sacrificial film from the upper surface of the dielectric layer and the upper surface of the exposed semiconductor fin;

FIG. 17 illustrates the semiconductor device of FIG. 16 following deposition of a contact liner against the outer surface of the sacrificial film and on an upper surface of the semiconductor fin;

FIG. 18 illustrates the semiconductor device of FIG. 17 after filing the trenches with a contact material and performing a planarization process to form a contact stack atop source/drain regions located at opposing sides of the gate stack;

FIG. 19 illustrates the semiconductor device of FIG. 18 following a selective etching process that removes the sacrificial film while maintaining the contact liner to form air gaps between the gate stack and the contact stacks; and FIG. 20 illustrates the semiconductor device of FIG. 19 following a replacement metal gate process to form a semiconductor device including a contact structure having self-aligned air gap spacers.

DETAILED DESCRIPTION

Figure 1:
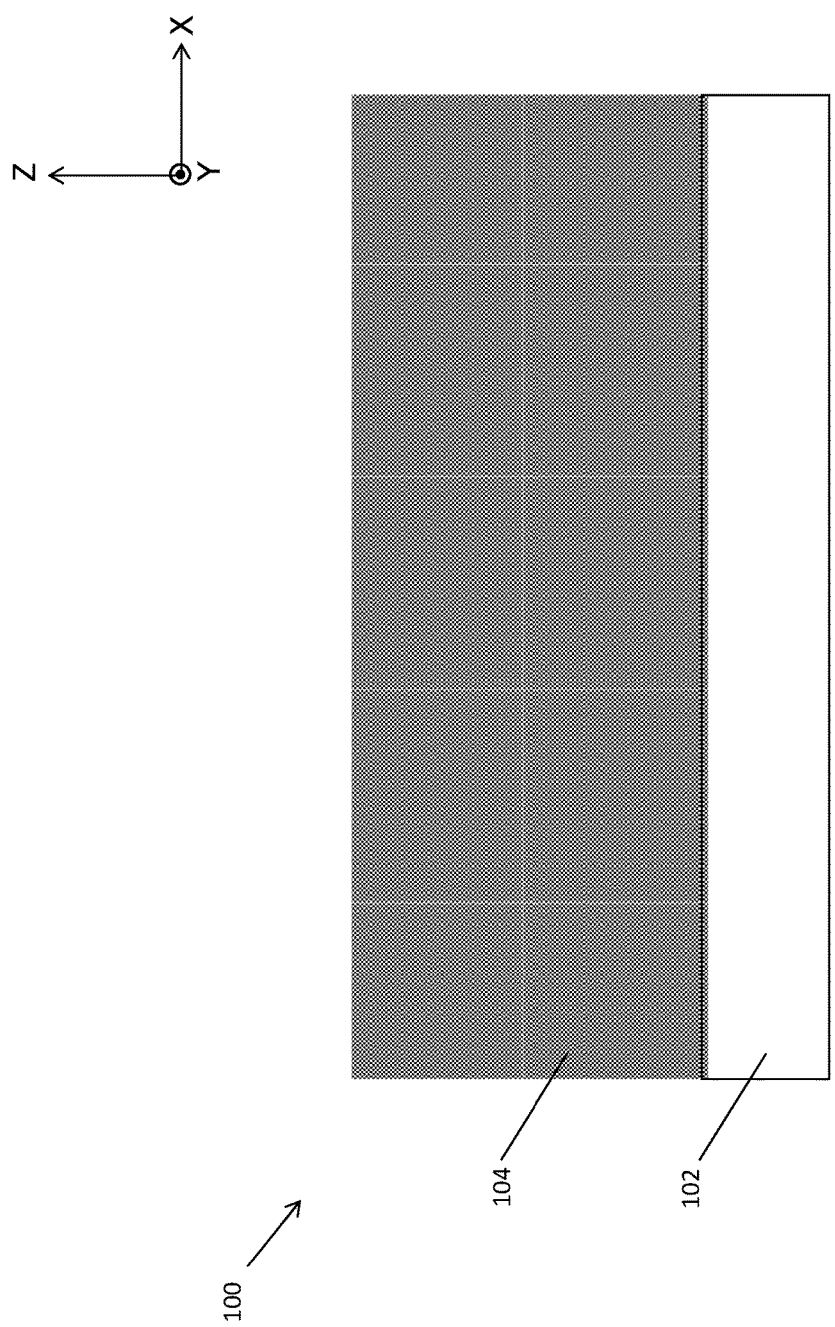

Various non-limiting embodiments of the present invention are described herein with reference to the related drawings. Alternative embodiments can be devised without departing from the scope of the invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the combination of operations and/or resulting structures of the present invention are unique. Thus, the unique combination of the operations described in connection with the present invention utilize a variety of individually known physical and chemical processes performed on a semiconductor (e.g., silicon) substrate.

In general, the various processes used to form a microchip that will be packaged into an IC fall into three categories, namely, film deposition, patterning, etching and semiconductor doping. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As demands for semiconductor devices with reduced footprints continue, the contact gate pitch is also reduced which increases undesirable parasitic capacitance between the gate contact and the S/D contacts. In structures implementing close-distance metal contacts or interconnects, an RC delay can exist. This RC delay is mainly due to the capacitive coupling between metal lines or the resistance of contact material used to form metal interconnects or conductive contact elements. The RC delay increases the propagation delay associated with the contact element or interconnects and thus limits the performance of the circuit.

The reduction of the RC delay is a key design driver in semiconductor fabrication and design. The introduction of low dielectric constant (low-k) materials is one way of reducing the capacitance of the delay, and thereby reducing the delay. The ideal low-k material for reducing RC delay is air.

Turning now to an overview of the present invention, one or more non-limiting embodiments address the above-described shortcomings by providing a semiconductor device including air gaps that isolate a first electrically contact stack from one or more neighboring electrically conductive contact stacks. One or more embodiments include a first air gap interposed between a dielectric layer and a contact liner formed on the first side wall of a contact stack, and a second air gap interposed between the dielectric layer and the contact liner on a second side wall of the contact stack. The air gaps have relatively low dielectric strengths (e.g., about 1 megavolts per meter to about 3 megavolts per meter MV/m). Therefore, the RC associated with contact structures provided by the invention are substantially reduced compared to conventional contact structures.

With reference now to FIG. 1, a starting semiconductor substrate 100 is illustrated. The substrate 100 extends along a first axis (e.g., X-axis) to define a length, a second axis (Y-axis) to define a width, and a third axis (Z-axis) to define a height. Although the starting substrate 100 is illustrated as a bulk substrate 100, it should be appreciated that the substrate 100 can be formed as a semiconductor-on-insulator (SOI) substrate without departing from the scope of the invention.

The substrate 100 includes an active semiconductor layer 102 and a dielectric layer 104 formed on an upper surface of the active semiconductor layer 102. The active semiconductor layer 102 can be formed from various semiconductor materials such as, for example, silicon (Si). The dielectric layer 104 is formed from any suitable dielectric material including, but not limited to, silicon dioxide ($SiO_2$), silicon nitride (SiN), and carbon-doped hydrogenated silicon oxide (SiOCH).

Figure 2:
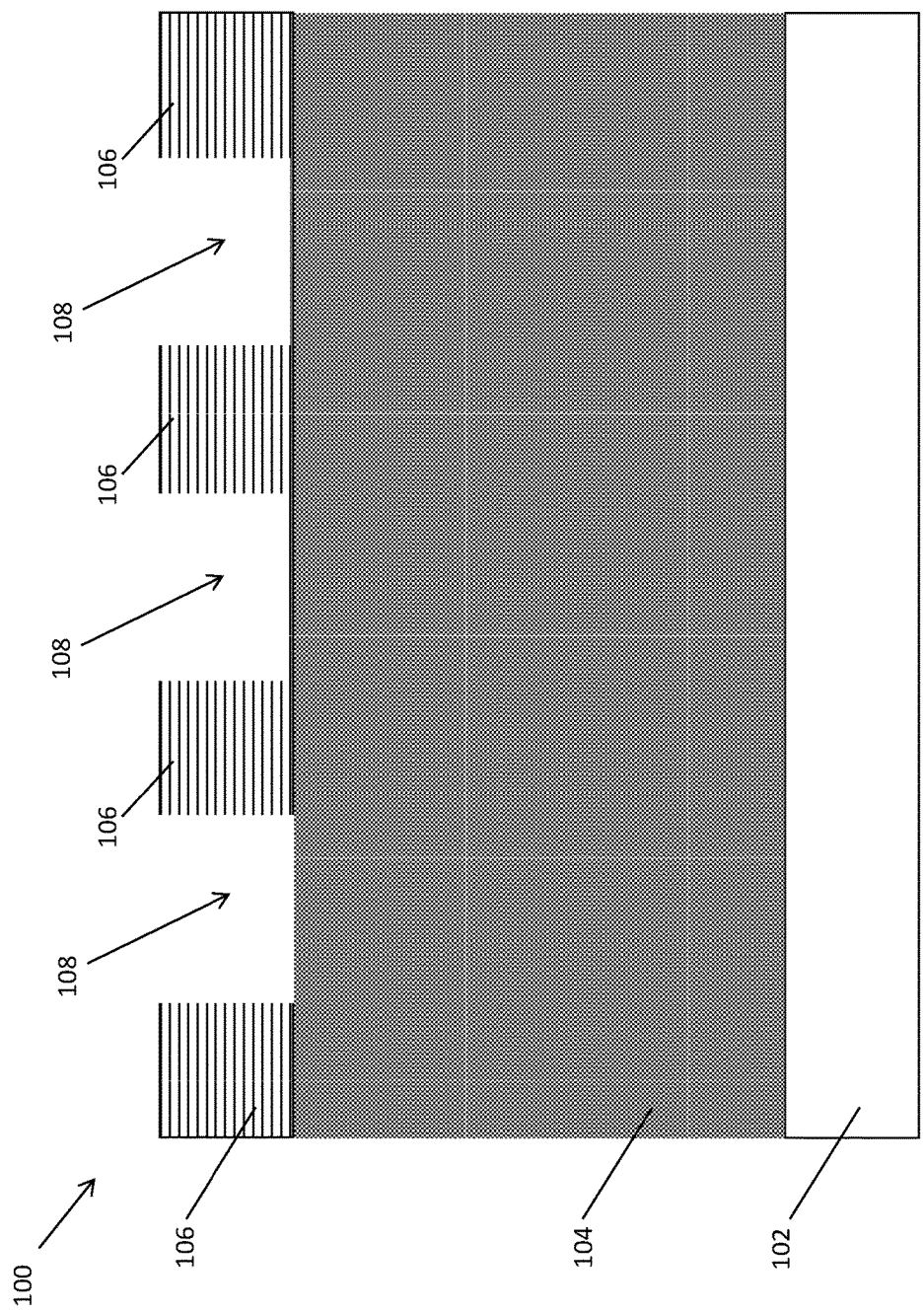

Turning to FIG. 2, the substrate 100 is illustrated after patterning a hardmask layer 106 formed on an upper surface of the dielectric layer 104. The hardmask layer 106 can be formed from a nitride material such as, for example, SiN, $Si_3N_4$, SiON, SiC, SiOC, or any combination thereof. The hardmask layer 106 can be patterned using a suitable lithography process that employs a photoresist layer (not shown) atop the hardmask layer. The photoresist layer can be patterned under a photo mask, and then etched to expose a portion of hardmask layer 106. The hardmask 106 is then etched such that the exposed material of the hardmask layer 106 is recessed while material covered by the photoresist layer is maintained. In this manner, one or more trenches 108 are formed in the hardmask layer 106, which expose a portion of the underlying dielectric layer 104.

The hardmask 106 can be etched using a reactive ion etching (ME) process various suitable etching processes including, but not limited to, a dry etching method such as plasma (e.g., fluorine containing plasma) etching, or a wet etching method such as, for example, an acid-based etching solution. The photoresist layer can then be stripped off. In some embodiments, the portion of the device can be cleaned after stripping off photoresist layer.

Figure 3:
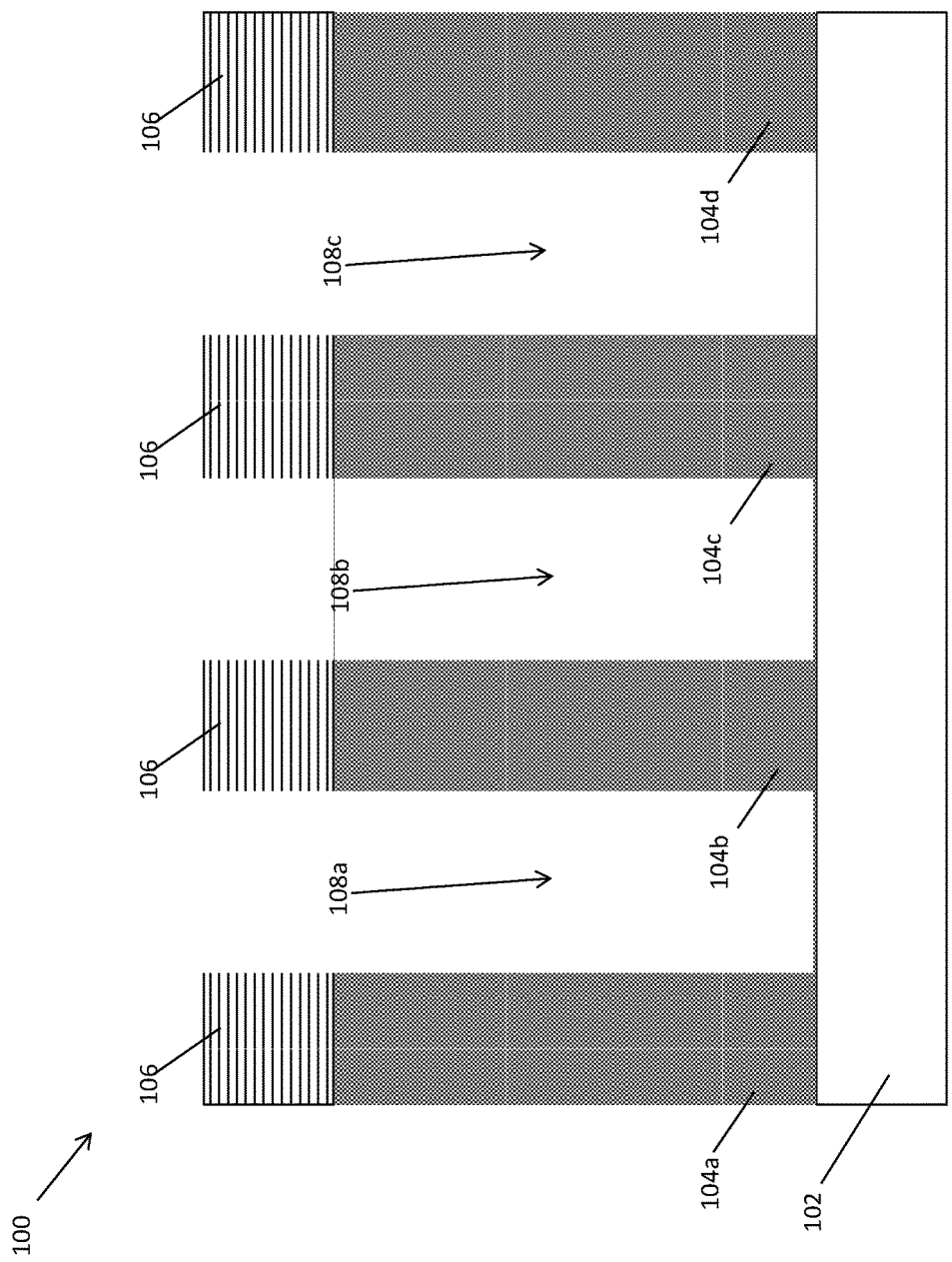

Referring to FIG. 3, the pattern of the hardmask 106 is transferred into the underlying dielectric layer 104. A ME process selective to the dielectric layer 104 can be used to etch the exposed portion of the dielectric layer 104. Accordingly, contact trenches 108a-108c are formed in the dielectric layer 104 so as to expose an upper surface of the underlying active semiconductor layer 102. The trenches 108a-108c have a horizontal thickness (Th) ranging from approximately 10 (nanometers) nm to approximately 20 nm. The trenches 108a-108c are separated from one another by a remaining dielectric portion 104a-104d. The remaining portions of the hardmask 106 can be stripped away from the upper surface of the hardmask portions 104a-104d after forming the trenches 108a-108c.

Figure 4:
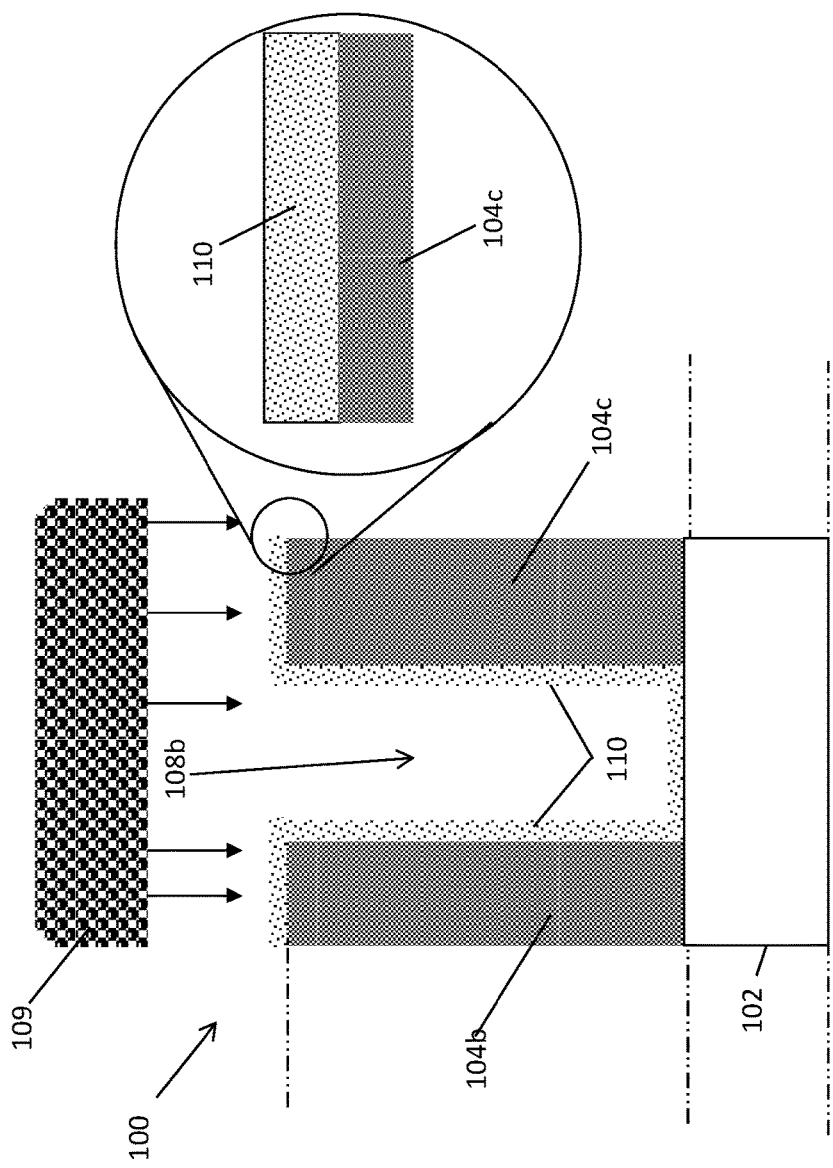

FIG. 4, illustrates a single trench (e.g., 108b) formed in the substrate 100. Going forward, the process flow will be described in terms of a single trench 108b, but it should be appreciated that the following operations of the process flow can be applied to the remaining trenches 108a and 108c.

Following removal of the remaining hardmask 106, a sacrificial film 110 is formed at the upper surface of the dielectric portions 104b-104c. The sacrificial film 110 is also formed at exposed surfaces of the dielectric portions 104b-104c, within the trench 108b, and on upper surface of the exposed active semiconductor layer 102. The thickness of the sacrificial film 110 ranges from approximately 1 nm to approximately 1.5 nm.

The sacrificial film 110 can be formed by performing a nitridation process 109 which converts a portion of the remaining dielectric material 104b-104c and exposed portions of the active semiconductor material 102 into the sacrificial film 110. For example, a plasma-enhanced nitridation process 109 or thermal nitridation process 109 can be applied to the dielectric portions 104b-104c and portions of the exposed semiconductor substrate portions 102 to convert these exposed surface portions into the sacrificial film 110 composed of a nitride-rich dielectric or nitrogen-based oxide material. The nitridation process can employ any suitable chemistry including, but not limited to, $N_2$, $NH_3$, or a combination of $N_2$ and $NH_3$.

Figure 5:
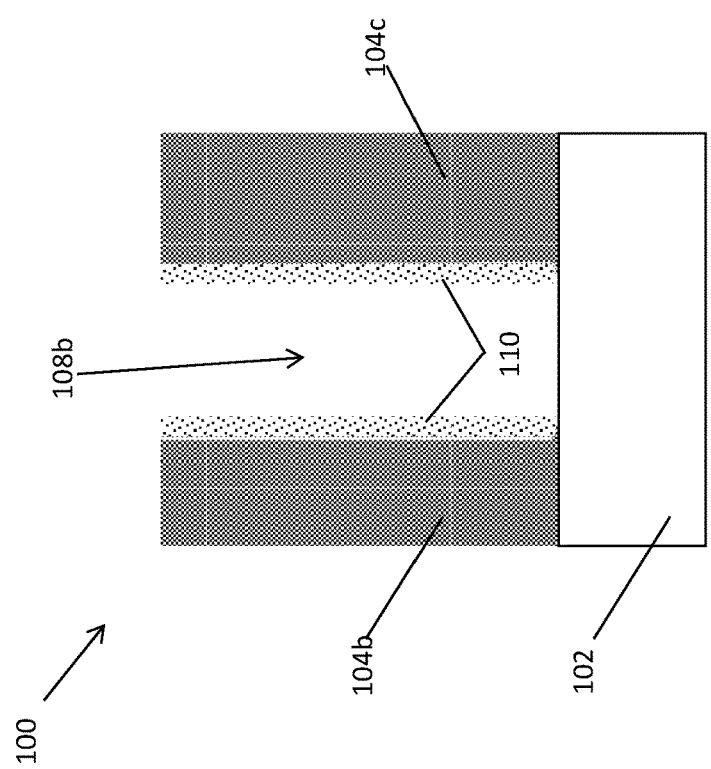

Referring to FIG. 5, the substrate 100 is illustrated after removing a portion of the sacrificial film 110 from the upper surface of the active semiconductor layer 102. The material of the sacrificial film 110 is different from the material of the dielectric portions 104b-104c and the active semiconductor layer 102. Accordingly, a suitable directional RIE process selective to the sacrificial film material 110 (e.g., nitrogen-rich oxide) can be used to remove a portion of the sacrificial film 110 from the upper surface of the active semiconductor layer 102. For example, a directional RIE process employing a chemically-reactive plasma composed of hydrogen ($H_2$), helium (He), or a mixture of both ($H_2$/He), can remove a portion of the sacrificial film 110 while preserving the underlying active semiconductor layer 102. Accordingly, a portion of the sacrificial film 110 is left remaining on sidewalls of the trench 108b as further illustrated in FIG. 5.

Figure 6:
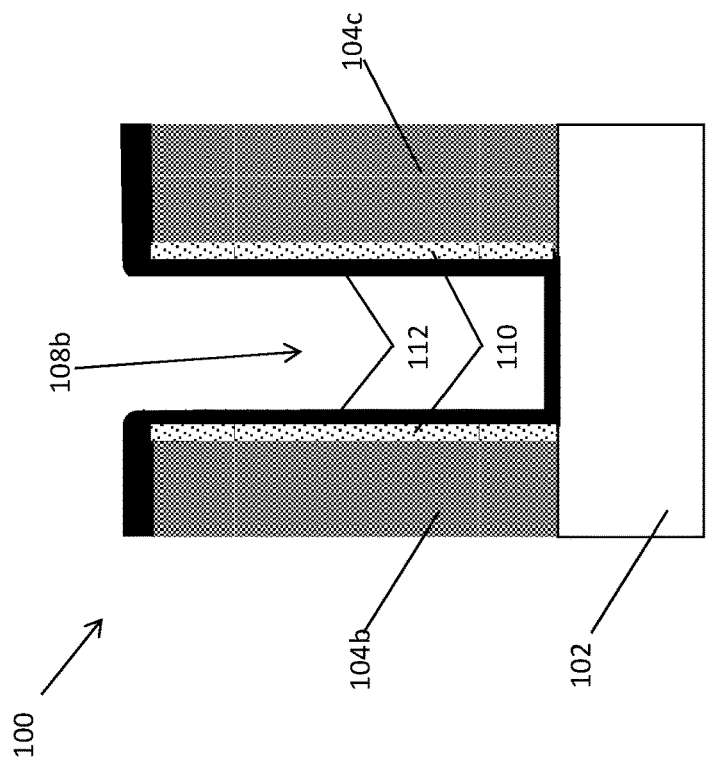

Turning now to FIG. 6, the substrate 100 is illustrated after depositing a contact liner 112 atop the dielectric portions 104b-104c and into the trench 108b. Accordingly, the contact liner 112 is formed against the outer surface of the sacrificial film 110 and on an upper surface of the active semiconductor layer 102. The contact liner 112 is composed of titanium (Ti), for example, and has a thickness ranging, for example, from approximately 1 nm to approximately 5 nm. Any suitable deposition process can be used to deposit the contact liner 112 including, but not limited to, an atomic layer deposition (ALD) and a chemical vapor deposition (CVD) process.

The combination of the sacrificial film 110 and the contact liner 112 forms layered contact liner. The layered contact liner includes a sacrificial portion and a preservation portion. In this case, for example, the layered contact liner is composed of titanium-nitride (TiN). The sacrificial portion is the nitride-rich sacrificial layer 110 while the preservation portion is the Ti contact liner 112. It can also be seen in FIG. 6 that the sacrificial film 110 serves as a buffer (i.e., is interposed) between inner sidewalls of the dielectric portions 104b-104c and the contact liner 112.

Figure 7:
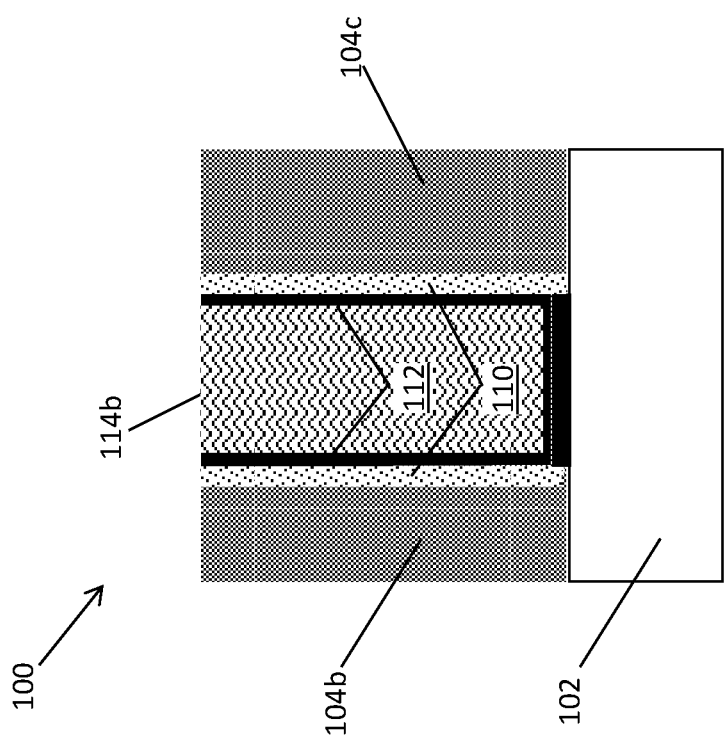

With reference now to FIG. 7, the semiconductor substrate 100 is illustrated after filling the trench 108b with a contact-fill material 114b. The contact-fill material 114b can be composed of a conductive material including, but not limited to, tungsten (W), copper (Cu) cobalt (Co), and ruthenium (Ru). Any suitable deposition process can be used to deposit the contact-fill material 114b such as, for example, an ALD process. A chemical-mechanical planarization process (CMP) can be performed, if necessary, to remove excess contact-fill material 114b from the upper surface of the substrate 100. Accordingly, a contact element 114b is formed having an upper surface that is flush with the contact liner 112, along with the upper surface of the dielectric portions 104b-104c as further illustrated in FIG. 7.

Figure 8:
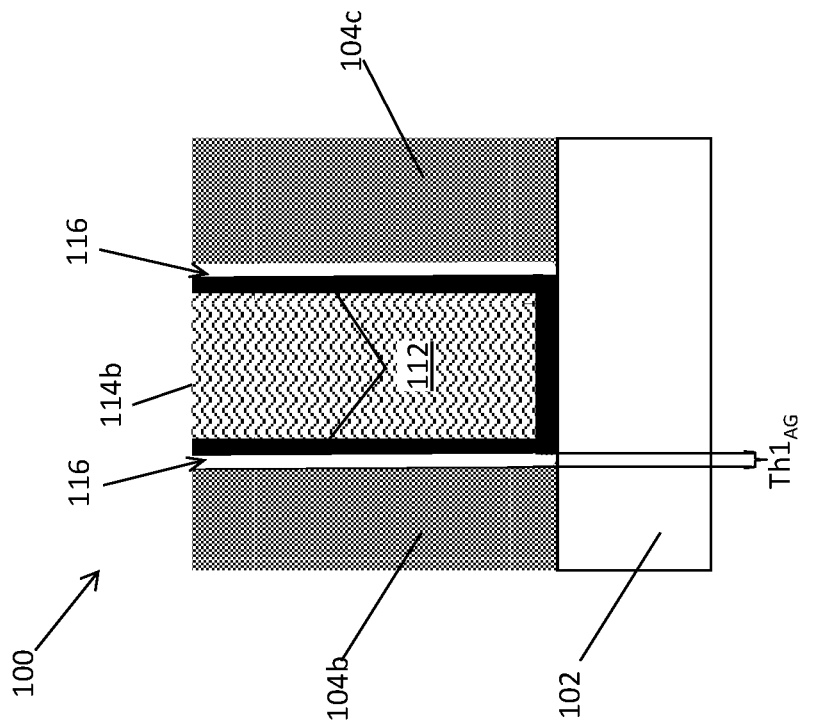

Turning to FIG. 8, a selective etching process is performed to remove the sacrificial film 110 while preserving the active semiconductor layer 102, the dielectric portions 104b-104c, the contact liner 112, and the contact element 114b. The selective etching process includes a wet etching process that employs an etching chemistry composed of hydrogen chloride (HCl) acid, or other commercially available deoxidizing solutions. In this manner, the wet etchant can attack the sacrificial film 110 while preserving the remaining materials and structures of the substrate 100.

As further illustrated in FIG. 8, the selective etching process forms an air gap 116 between the dielectric portions 104b-104c and the contact liner 112. The air gaps 116 have a horizontal width (e.g., along the X-axis) that is the same, or substantially the same, as the width of the previously existing sacrificial film 110. For example, the thickness ($Th1_{AG}$) of the air gaps 116 can range, for example, from approximately 1 nm to approximately 1.5 nm.

Figure 9:
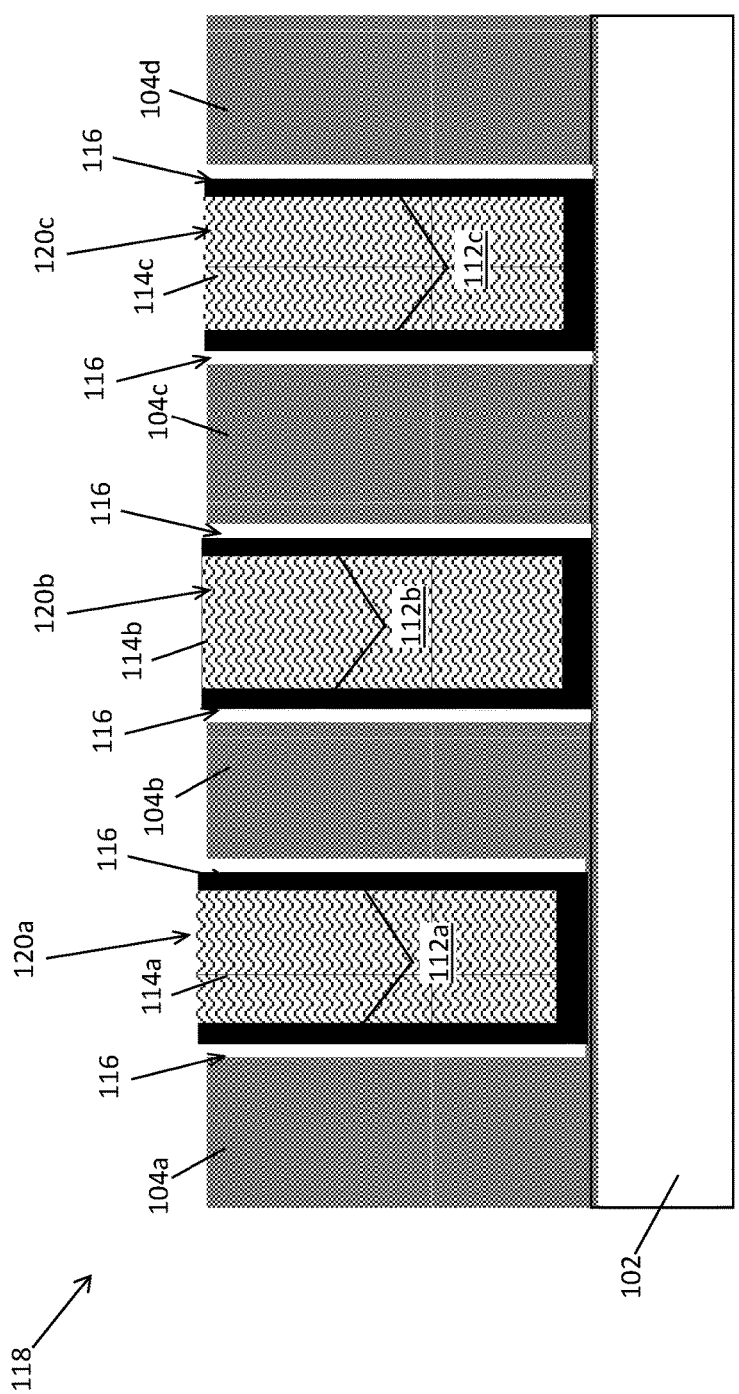

Referring to FIG. 9, a completed structure 118 is illustrated following the process flow described herein. The structure 118 includes one or more contact stacks 120a-120c formed atop an active semiconductor layer 102. Each contact stack 120a-120c is separated from one another by a dielectric portion 104a-104d.

The contact stacks 120a-120c include a contact liner 112a-112c and a contact element 114a-114c. The contact liner 112a-112c is interposed between the active semiconductor layer 102 and a respective contact element 114a-114c. The contact liner 112a-112c also extends vertically from the upper surface of the active semiconductor substrate 102 to line the sidewalls of a respective contact element 114a-114c.

The completed structure 118 further includes air gaps 116 interposed between sidewalls of the contact liners 112a-112c and the dielectric portions 104a-104d. The air gaps 114a-114c serve as a low-dielectric (low-k) spacers and are configured to reduce the parasitic capacitance and RC delay between the neighboring contact stacks 120a-120c. It should be appreciated that although electrically conductive contacts stacks 120a-120c are described in FIG. 9, the air gaps 116 can be employed in other device applications such as, for example, electrically conductive via structures.

Figure 10:
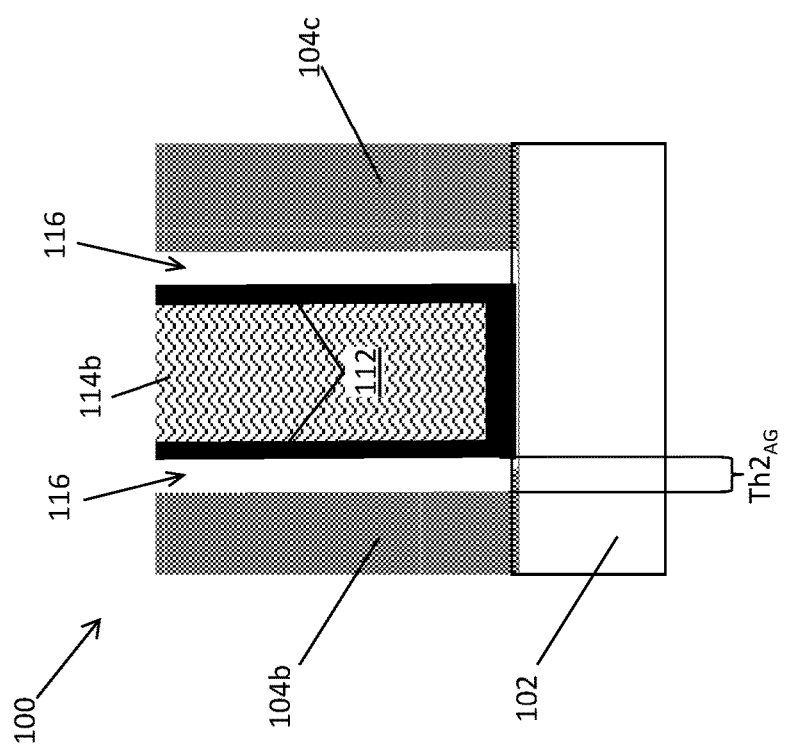

Another embodiment of the invention shown in FIG. 10 illustrates a portion of the completed device 118 following an optional second etching process to increase the horizontal width (e.g., along the X-axis) of the air gaps 116 beyond the thickness of the previously existing sacrificial layer 110. For instance, a second selective etching process can be performed after forming the air gaps 116. The second selective etching process is selective to the dielectric portions 104b-104c with respect to the active semiconductor layer 102, the contact liner 112, and the contact element 114a-114c. That is, the second etching process attacks the dielectric portions 104b-104c while preserving the semiconductor layer 102, the contact liner 112, and the contact element 114. Accordingly, the air gaps 116 can be enlarged to define a second air gap width ($Th2_{AG}$) that is greater than the first air gap width ($Th1_{AG}$) described above. In this manner, parasitic capacitance and RC delay between neighboring contact elements 114a-114c or conductive via lines can be further reduced. The width of the air gaps 116 can also be increased such that they are greater than the width of the contact liner 112, i.e., the preservation portion.

Turning now to FIGS. 11A-20, a series of diagrams illustrates a process flow for forming a semiconductor device including air gap spacers configured to reduce the parasitic capacitance and RC delay between an electrically conductive gate stack and one or more source/drain (S/D) contacts.

Figure 11A:
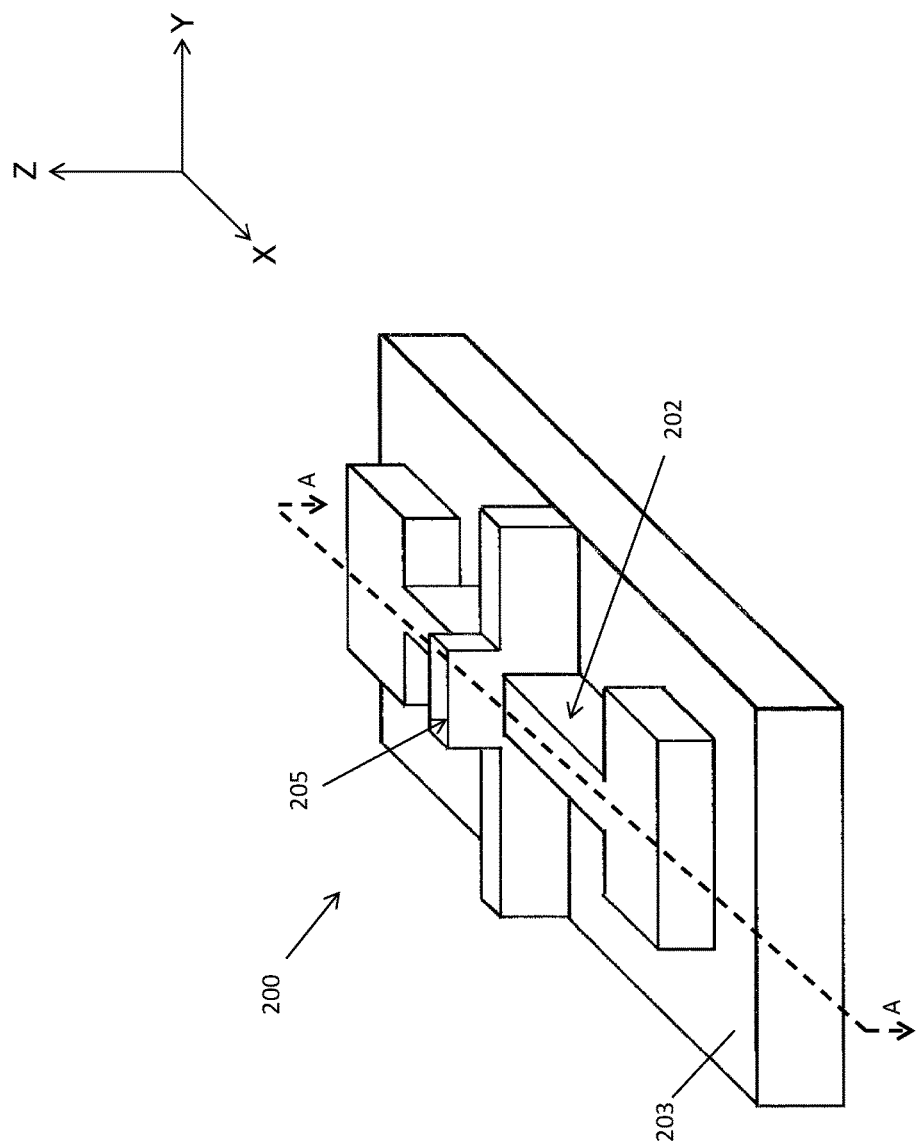
Figure 11B:
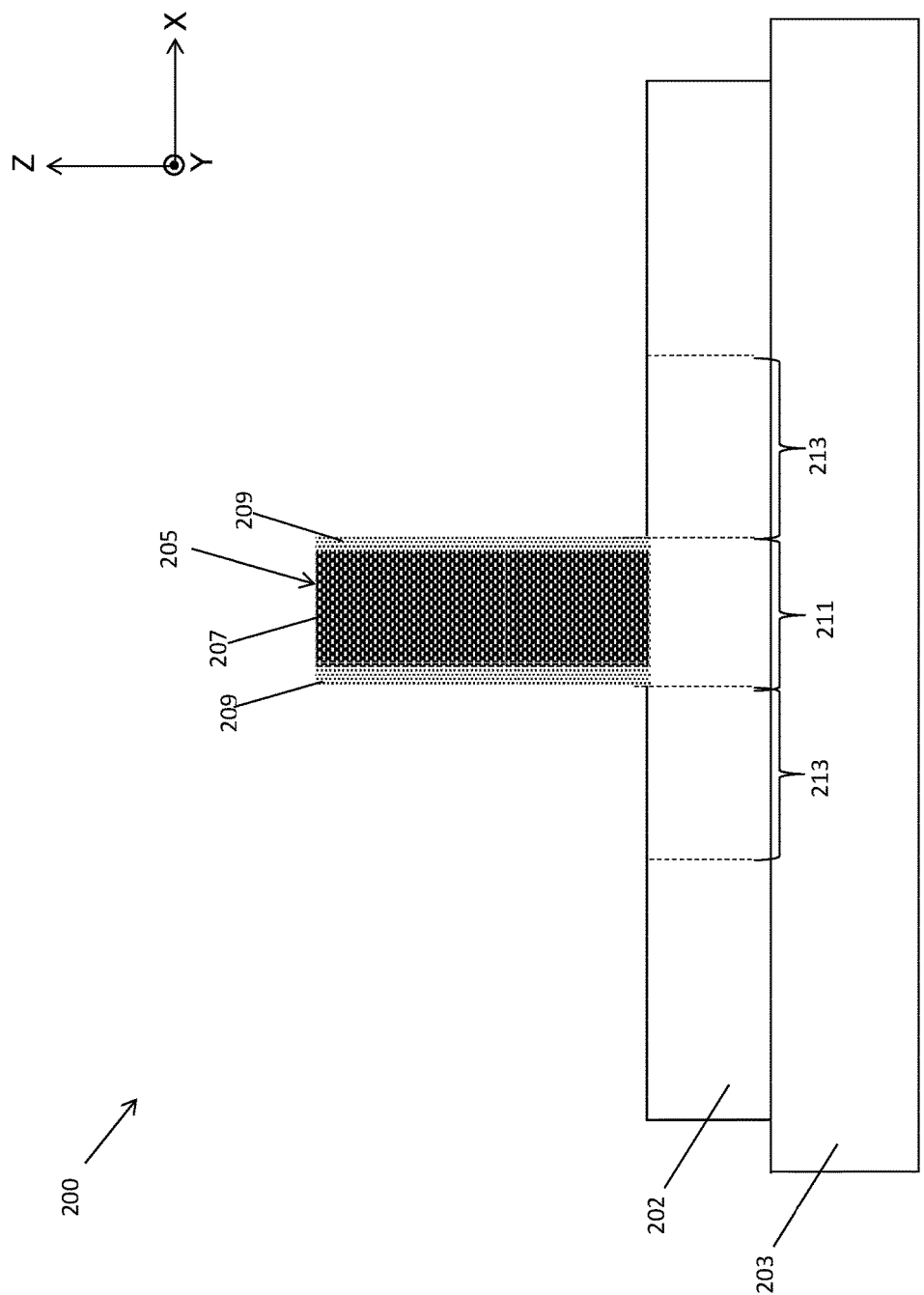
FIG. 11B is a length-wise (e.g., X-axis) cross-sectional view taken along line A-A extending through a center of the semiconductor fin.

With reference to FIGS. 11A-11B, a starting semiconductor device 200 extends along a first axis (e.g., X-axis) to define a length, a second axis (Y-axis) to define a width, and a third axis (Z-axis) to define a height. The starting semiconductor device 200 includes one or more semiconductor fins 202 formed atop a semiconductor substrate 203. The semiconductor substrate 203 and semiconductor fin 202 are formed from various suitable semiconductor materials including, but not limited to, Si and silicon germanium (SiGe). The semiconductor substrate 203 can be formed as a bulk substrate or a SOI substrate without departing from the scope of the invention.

The starting semiconductor device 200 further includes a sacrificial a sacrificial gate stack 205 (i.e., dummy gate stack 205) formed on an upper surface of the substrate 203. The sacrificial gate stack 205 wraps around an outer surface of the fin 202 to define a channel region 211 that is interposed between an opposing pair of designated source/drain regions 213. The sacrificial gate stack 205 includes a sacrificial gate element 207 (i.e., a dummy gate element 207) and gate spacers 209 formed on the sidewalls of the sacrificial gate element 207. Although not illustrated, the sacrificial gate stack 205 can also include a gate dielectric (not shown) interposed between the sacrificial gate element 207 and the fin 202.

The sacrificial gate element 207 is composed of a sacrificial gate material such as polysilicon (PolySi), for example. The overall height of the sacrificial gate element 207 ranges, for example, from approximately 20 nm to approximately 100 nm. The gate spacers 209 can be formed from a nitride material such as, for example, SiN. The gate dielectric can include a high-k gate dielectric that is maintained after replacing the sacrificial gate element 207 with a conductive gate element (not shown in FIGS. 11A-11B), or can include a sacrificial gate dielectric that is replaced by a high-k gate dielectric prior to forming the conductive gate element. Various suitable gate formation techniques can be employed to form the sacrificial gate stack 205 as understood by one of ordinary skill in the art.

Figure 12:
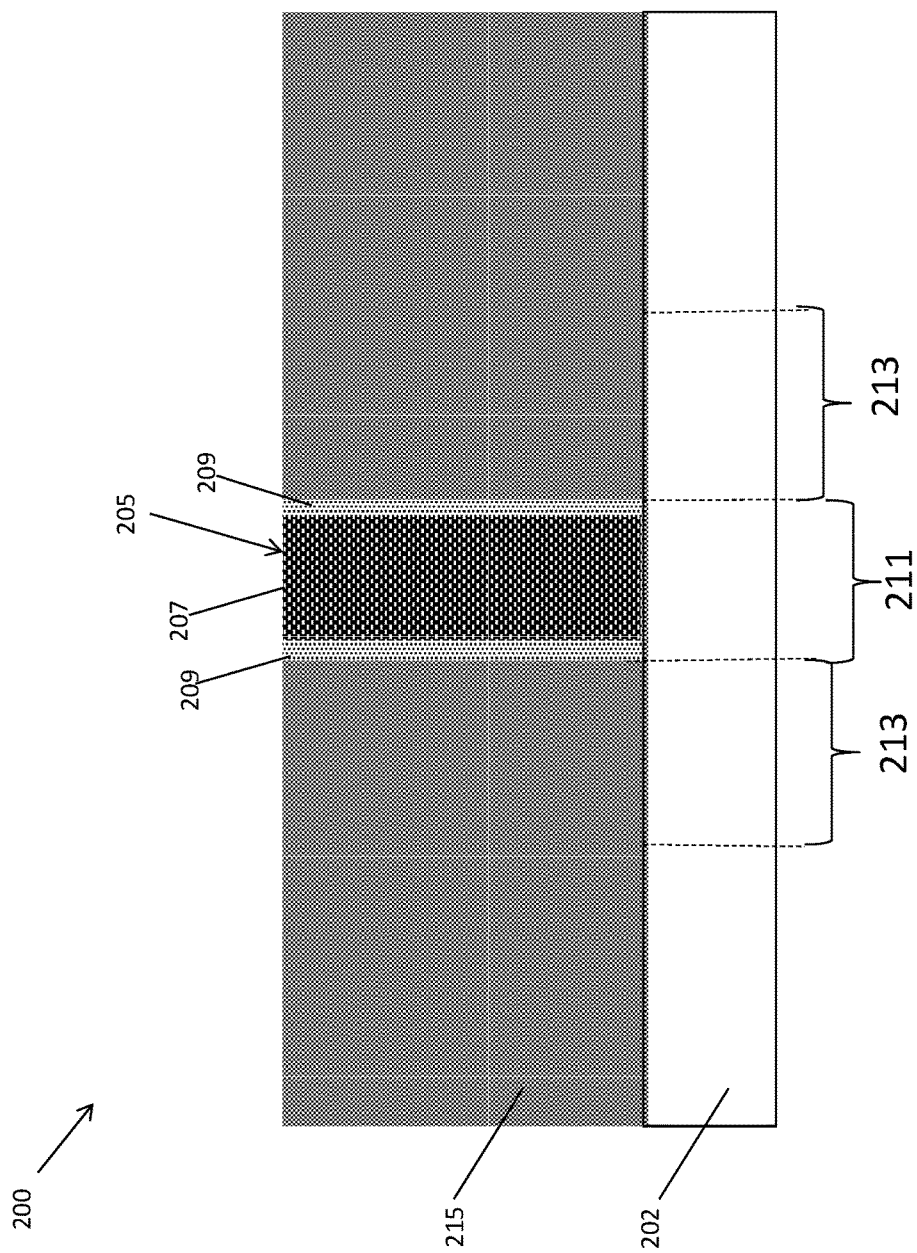

Turning to FIG. 12, the semiconductor device 200 is illustrated following deposition of a dielectric layer 215 such as, for example, an interlayer dielectric (ILD) 215. The ILD 215 is deposited atop the semiconductor substrate 203 to cover the fin 202 and the gate stack 205. A chemical-mechanical planarization (CMP) process can then be performed so as to planarize the upper surface of the ILD 215 and expose the upper surface of the sacrificial gate element 207 as further illustrated in FIG. 12.

Figure 13:
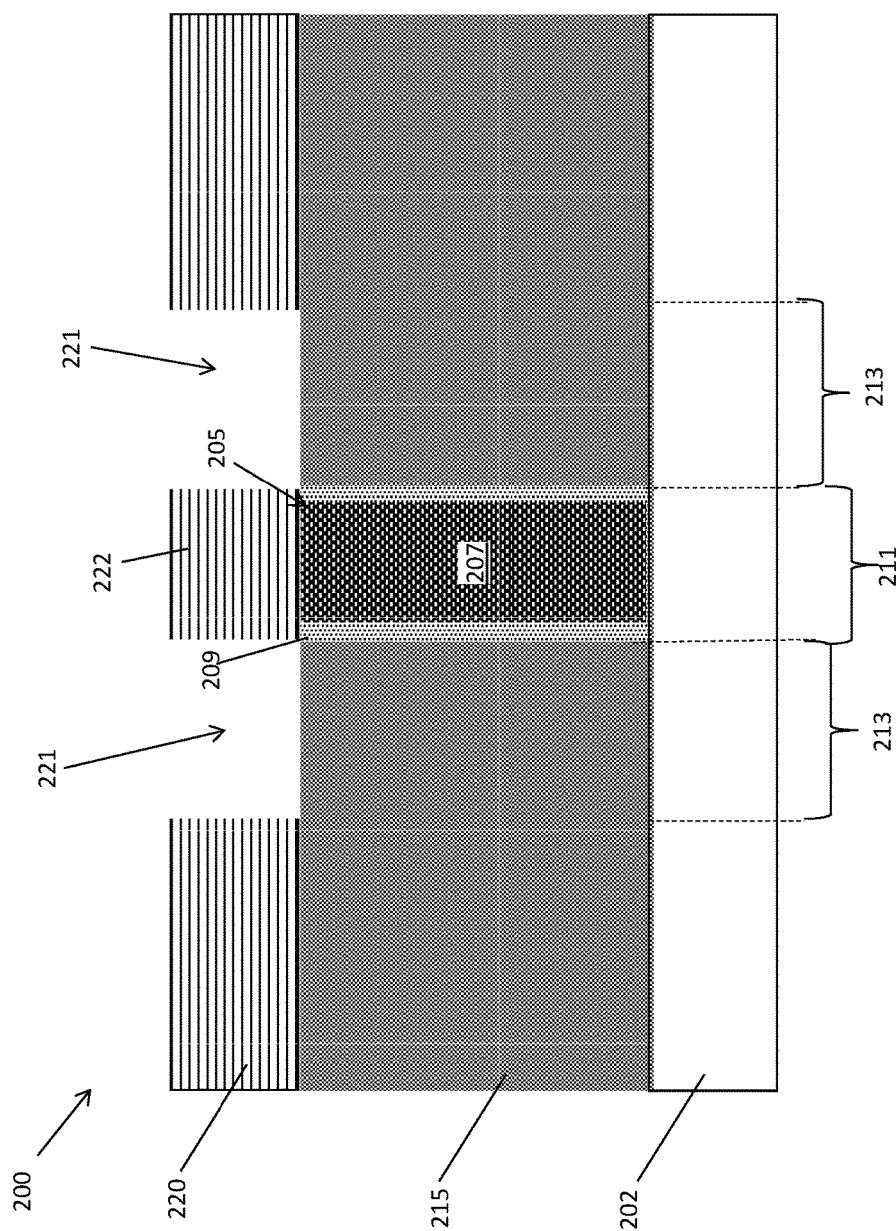

Referring now to FIG. 13, the semiconductor device 200 is illustrated after patterning a hardmask layer 220 formed on an upper surface of the ILD 215. The hardmask layer 220 can be formed from various materials including SiN, for example, and can be deposited using a suitable deposition method such as chemical vapor deposition (CVD), for example. The hardmask layer 220 is patterned using suitable lithography and etching processes to form trenches 221 which expose portions of the underlying ILD 215. The trenches 221 are aligned with the source/drain regions 213, and further define a gate cap 222 that is formed atop the sacrificial gate stack 205.

Figure 14:
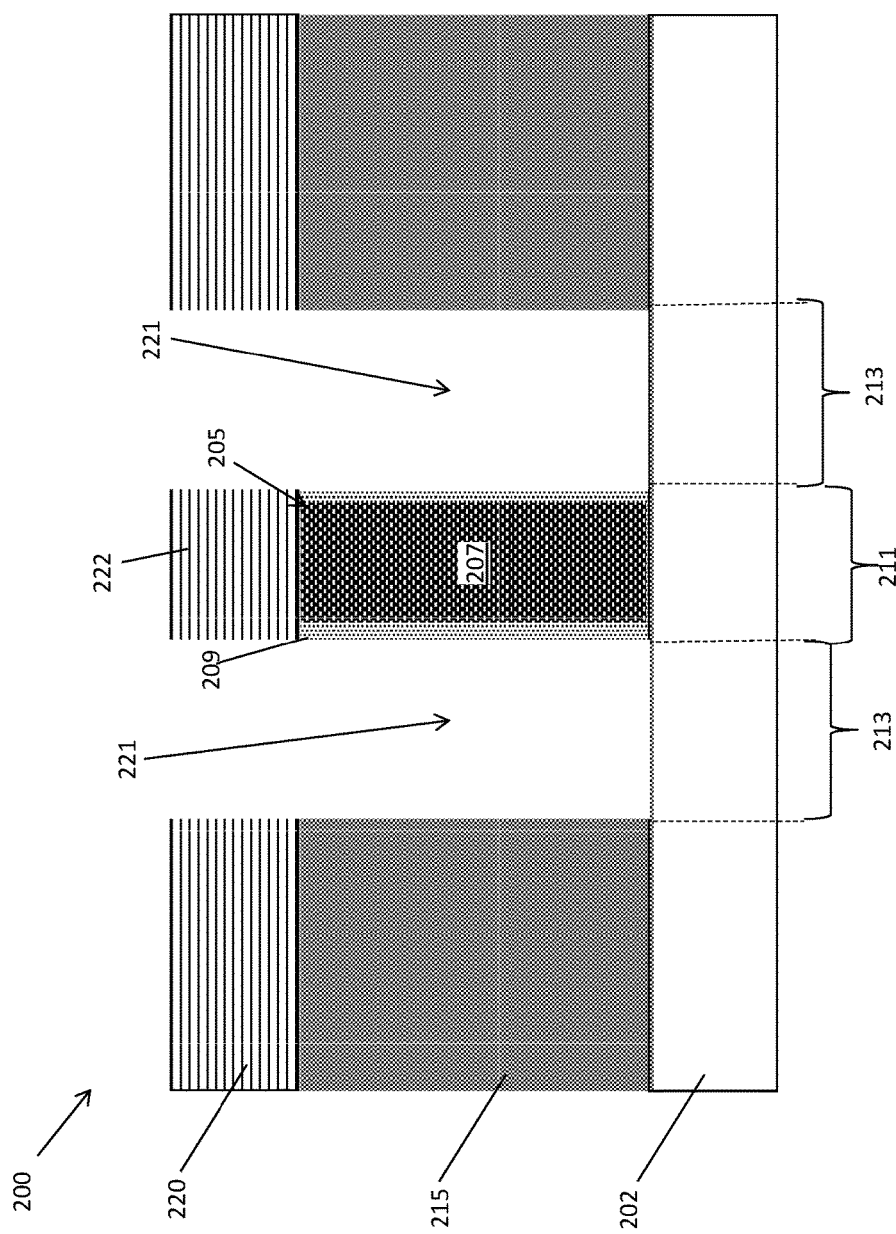

Turning to FIG. 14, the semiconductor device 200 is illustrated following a directional etching process that extends the trenches 221 into the ILD 215. A suitable directional etching process such as, for example, an RIE process selective to the material of the ILD 215 (e.g., SiBCN) can be employed. In this manner, RIE process can be performed until reaching the upper surface of the semiconductor fin 202. Accordingly, a portion of the semiconductor fin 202 is exposed via the trenches 221 as further illustrated in FIG. 14.

Figure 15:
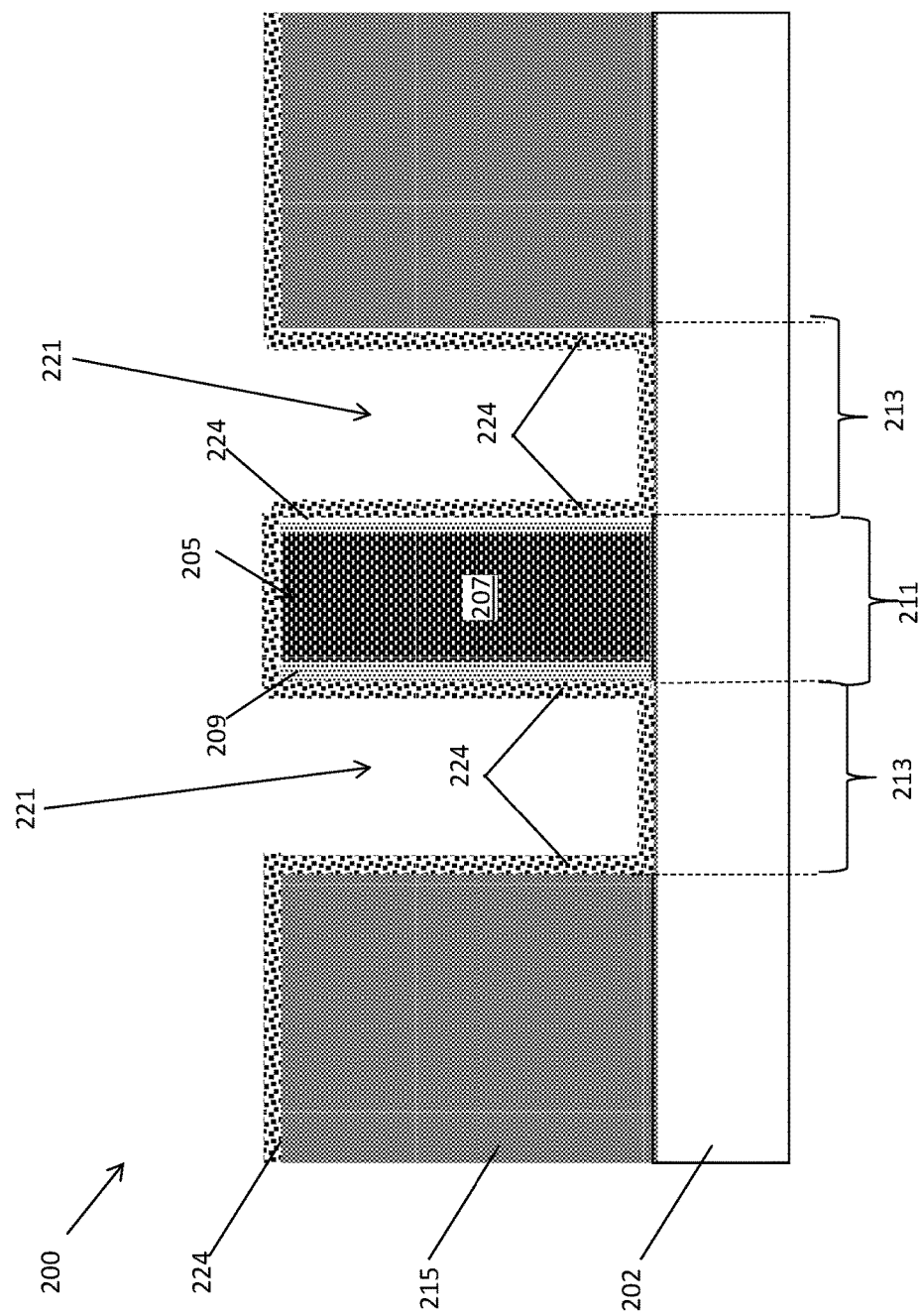
Figure 16:
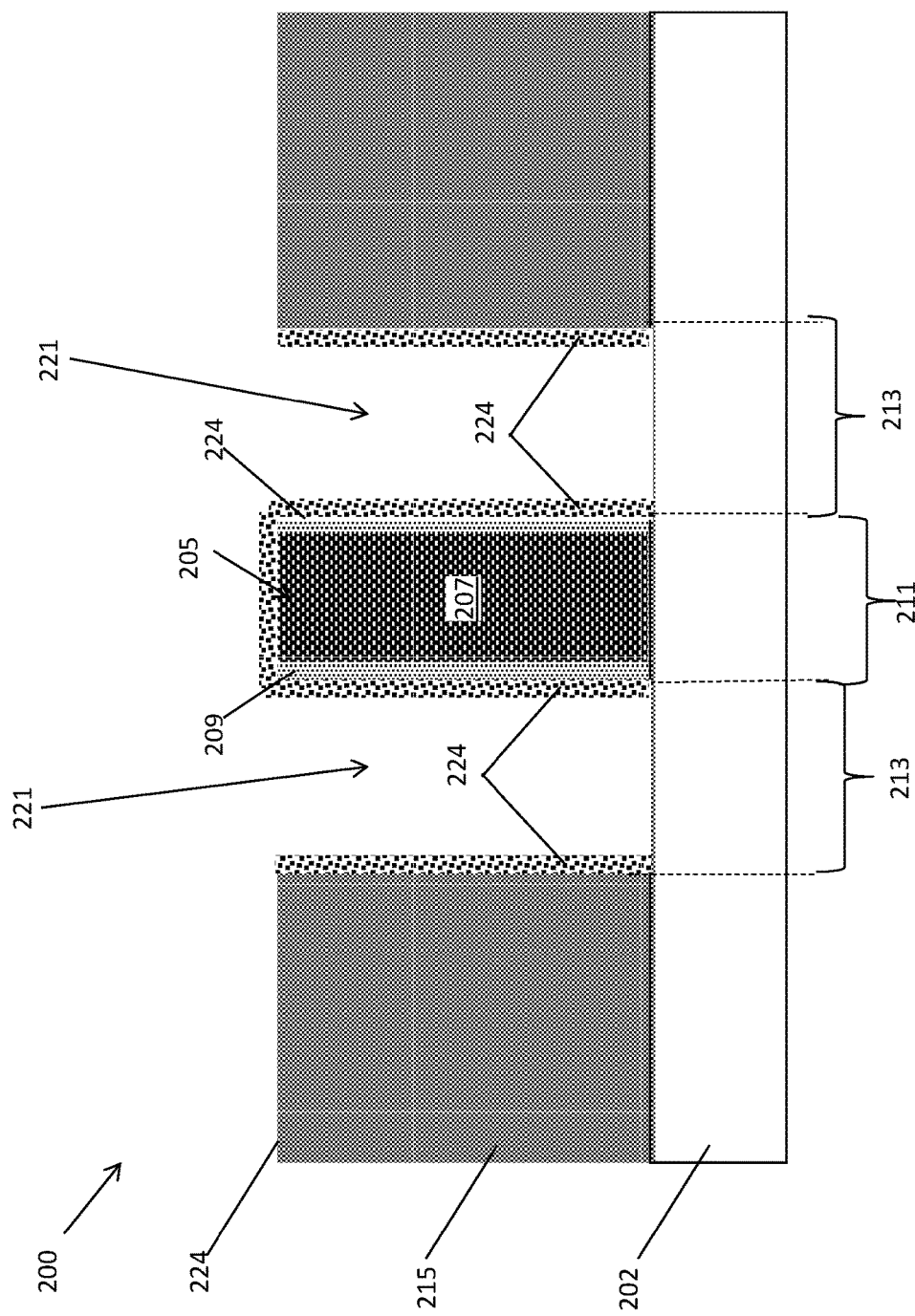

With reference now to FIG. 15, the semiconductor device 200 is illustrated following deposition of a sacrificial film 224. The sacrificial film 224 is formed at the upper surface of the ILD 215. The sacrificial film 224 is also formed at exposed sidewalls surfaces of trench 221, the upper surface of the exposed fin 202, and at the outer surface of the gate spacers 209. The thickness of the sacrificial film 224 ranges from approximately 1 nm to approximately 1.5 nm.

The sacrificial film 224 can be formed by performing a nitridation process which converts portions of the ILD 215, the exposed semiconductor fin 202 and the gate spacers 209 into the sacrificial film 224. For example, a plasma-enhanced nitridation process or thermal nitridation process can be performed to form a sacrificial film 224 composed of a nitride-rich dielectric or nitrogen-based oxide material. The nitridation process can employ any suitable chemistry including, but not limited to, $N_2$, $NH_3$, or a combination of $N_2$ and Referring to FIG. 16, the semiconductor device 200 is illustrated after removing a portion of the sacrificial film 224 from the upper surface of the semiconductor fin 202 exposed by the trenches 221. The material of the sacrificial film 224 is different from the material of the ILD 215 and the semiconductor fin 202. Accordingly, a suitable directional RIE process selective to the sacrificial film material 24 (e.g., nitrogen-rich oxide) can be used to remove a portion of the sacrificial film 224 from the upper surface of the semiconductor fin 202. For example, a directional RIE process employing a chemically-reactive plasma composed of hydrogen ($H_2$), helium (He), or a mixture of both ($H_2$/He), can remove a portion of the sacrificial film 224 while preserving the underlying portion of the fin 202. Accordingly, a portion of the sacrificial film 224 is left remaining on sidewalls of the gate spacers 209 as further illustrated in FIG. 16.

Figure 17:
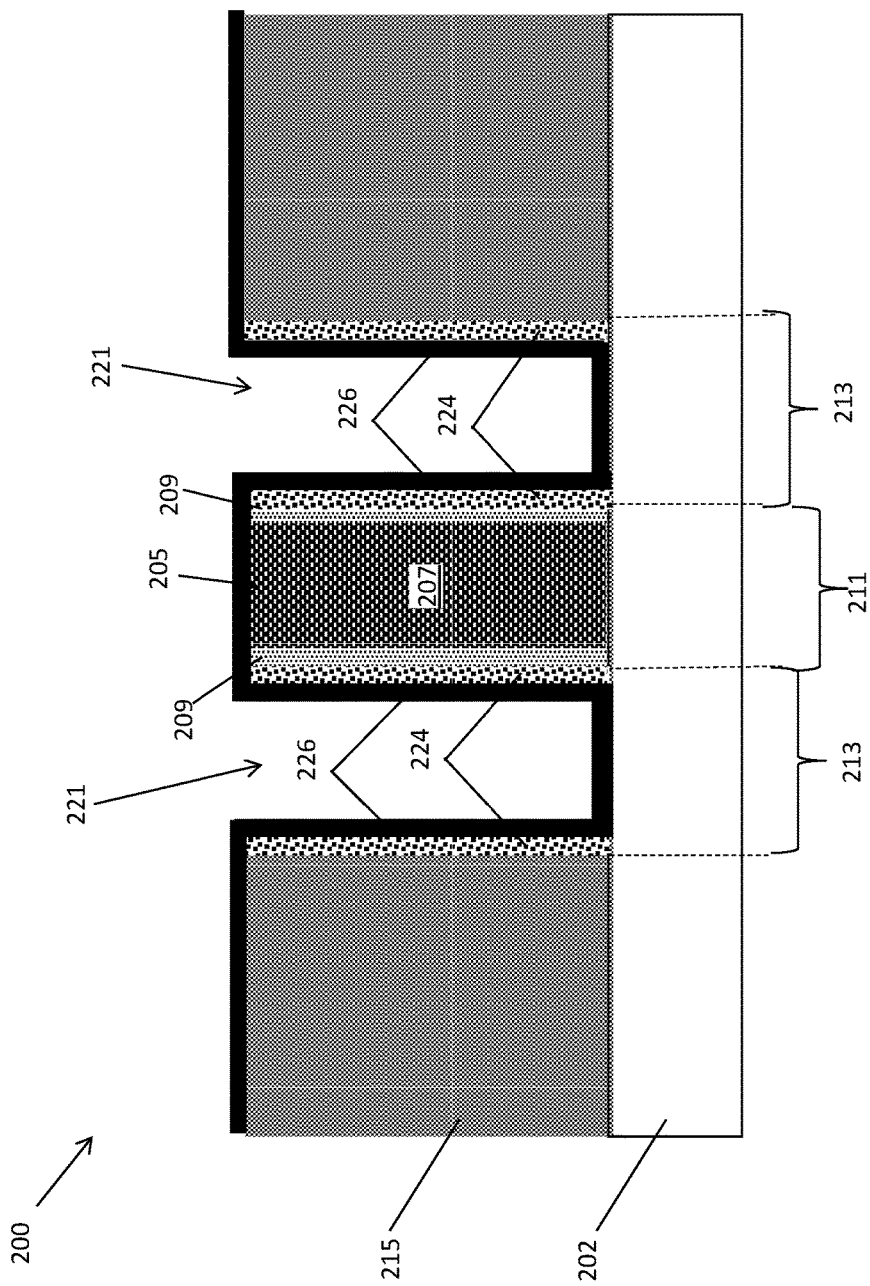

Turning now to FIG. 17, the semiconductor device 200 is illustrated after depositing a contact liner 226 atop the ILD 215 and into the trenches 221. Accordingly, the contact liner 226 is formed against the outer surface of the sacrificial film 224 and on an upper surface of the fin 202. The contact liner 226 is composed of titanium (Ti), for example, and has a thickness ranging, for example, from approximately 1 nm to approximately 5 nm. Any suitable deposition process can be used to deposit the contact liner 226 including, but not limited to, an ALD process and a CVD process. Accordingly, a layered contact liner is formed having a sacrificial portion and a preservation portion. In this case, for example, the layered contact is includes titanium-nitride (TiN). The sacrificial portion is the nitride-rich sacrificial layer 224 while the preservation portion is the Ti contact liner 226. It can also be seen in FIG. 17 that the sacrificial film 224 serves as a buffer (i.e., is interposed) between the contact liner 226, and inner sidewalls of the ILD 215 along with the gate spacers 209.

Figure 18:
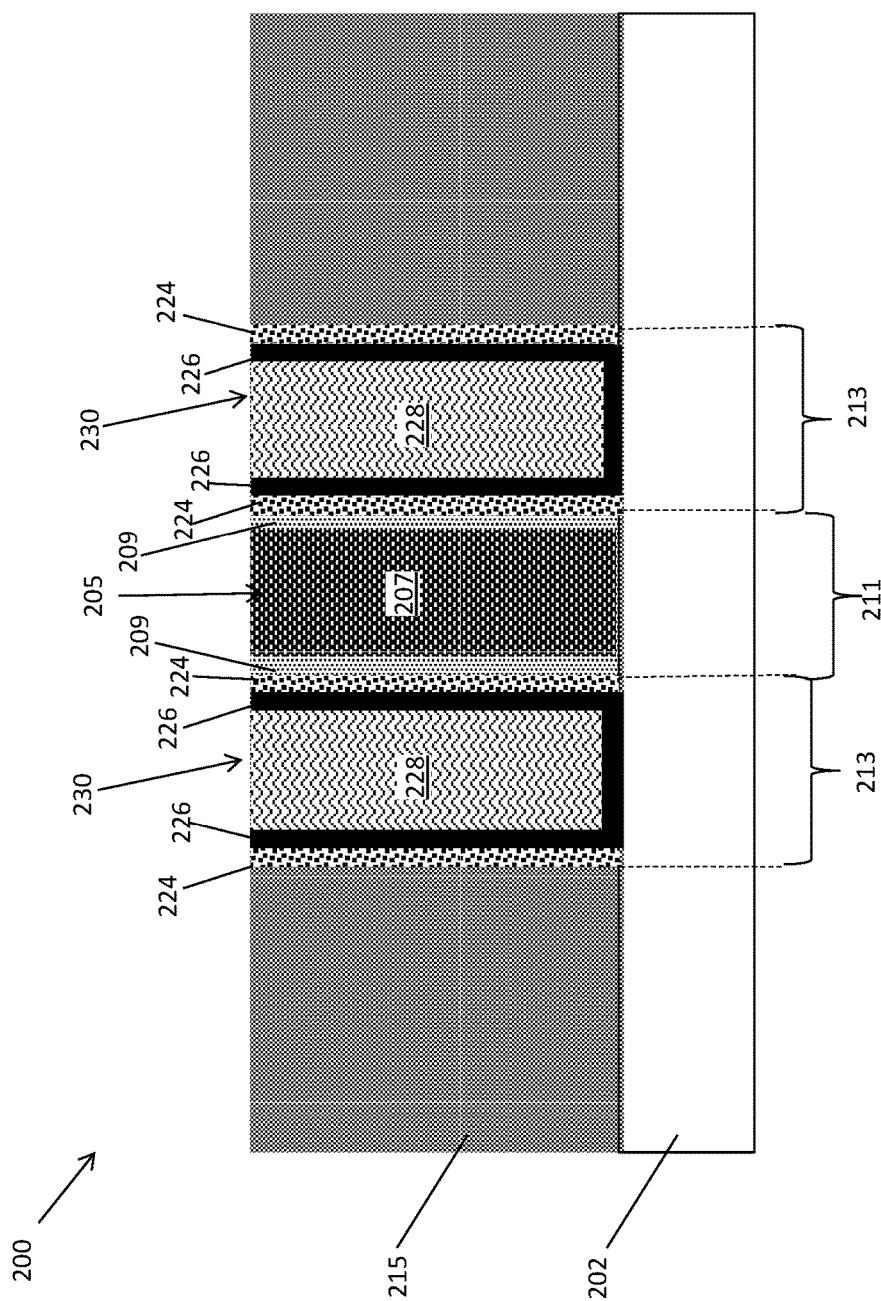

Referring to FIG. 18, the semiconductor device 200 is illustrated after filling the trenches 221 with a contact-fill material 228. The contact-fill material 228 can be composed of a conductive material including, but not limited to, tungsten (W), copper (Cu) cobalt (Co), and ruthenium (Ru). Any suitable deposition process can be used to deposit the contact-fill material 228 such as, for example, an ALD process. A CMP process can be performed, if necessary, to remove excess contact-fill material 228 from the upper surfaces of the ILD 215 and gate stack 205. Accordingly, a contact stack 230 is formed. The contact stack 230 includes the contact element 228 and the contact liner 226 having upper surfaces that are flush with the upper surface of the sacrificial layer 224, the ILD 215, and the gate stack 205 as further illustrated in FIG. 18.

Figure 19:
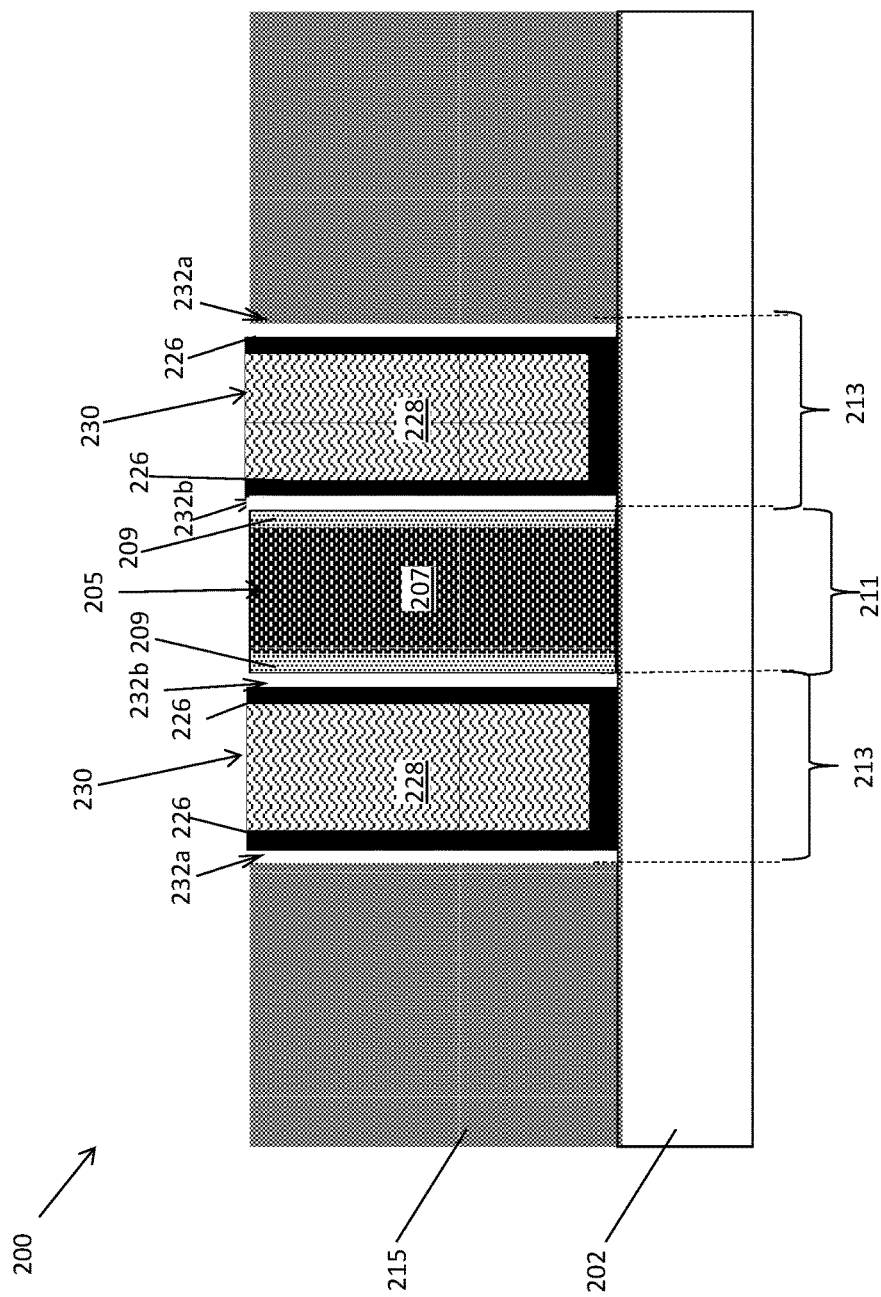

With reference to FIG. 19, a selective etching process is performed to remove the sacrificial film 224 while preserving the semiconductor fin 202, the ILD 215, the contact liner 226, and the gate stack 205. The selective etching process includes a wet etching process that employs an etching chemistry composed of hydrogen chloride (HCl) acid, or other commercially available deoxidizing solutions.

As further illustrated in FIG. 19, the selective etching process forms a pair of air gaps 232a-232b that electrically isolates each contact stack 230 from the ILD 215 and the gate stack 205. For instance, a first air gap 232a is interposed between the ILD 215 and the contact liner 226 formed on a first sidewall of the contact element 228. A second air gap 232b is interposed between a respective gate spacer 209 and the contact liner 226 formed on a second sidewall of the contact element 228.

The air gaps 232a-232b have a horizontal width (e.g., along the X-axis) that is the same, or substantially the same, as the width of the previously existing sacrificial film 224. For example, the thickness ($Th1_{AG}$) of the air gaps 232a-232b can range, for example, from approximately 1 nm to approximately 1.5 nm.

Figure 20:
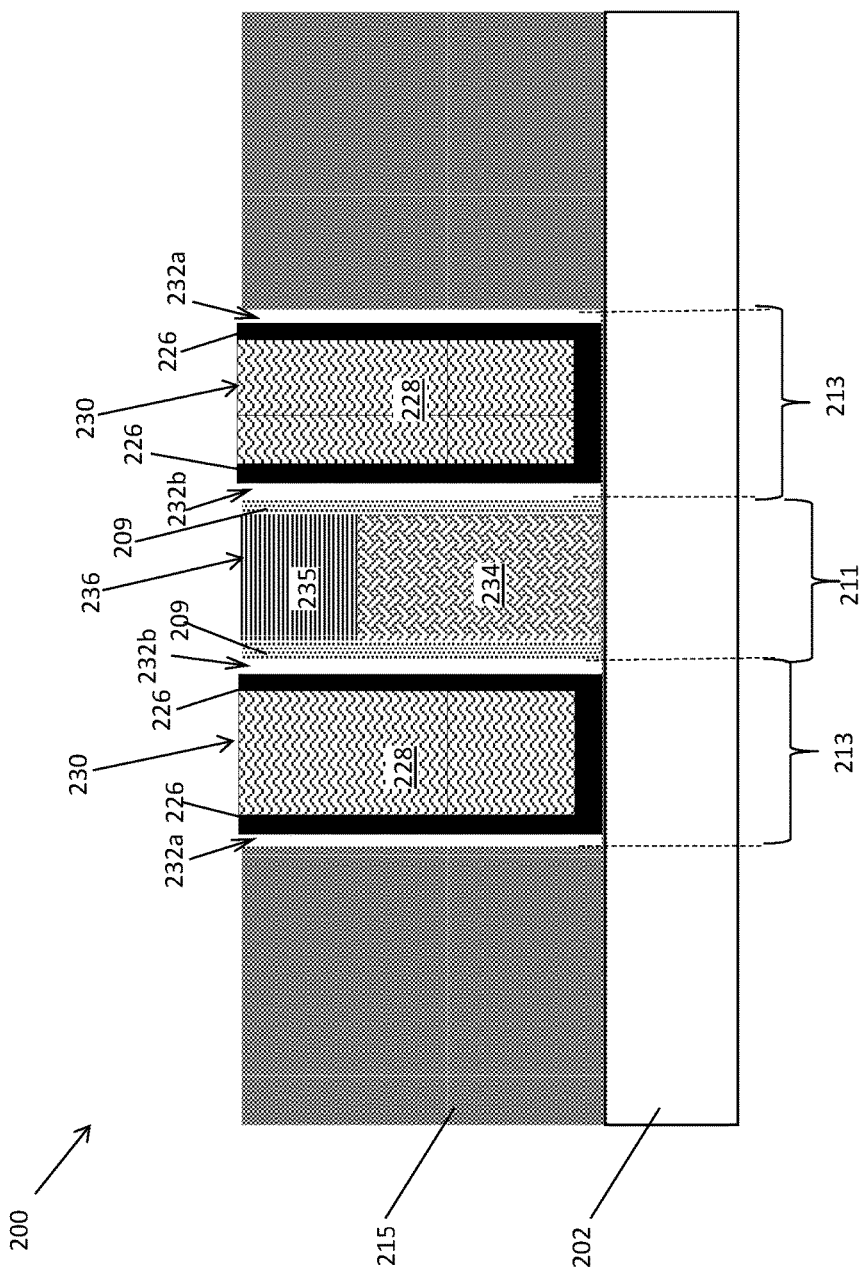

Turning now to FIG. 20, the semiconductor structure 200 (e.g., finFET 200) is illustrated following a typical replacement metal gate (RMG) process. The RMG process replaces the sacrificial gate element 207 with an electrically conductive gate element 234 to form a gate stack 236. The RMG process can also include replacing a sacrificial gate dielectric with a high-k gate dielectric (not shown) and forming a gate cap 235 on an upper surface of the conductive gate element 234. The gate cap 235 is composed, for example, of SiN. It should be appreciated that the gate cap 235 can be removed after completing various middle-of-line (MOL) and/or back-end-of-line (BEOL) processing operations.

As further illustrated in FIG. 20, the air gaps 232a-232b electrically isolate the gate stacks 230 from the ILD 215 and the conductive gate stack 236. In this manner, the air gaps 232a-232b serve as low-dielectric (low-k) spacers and are configured to reduce the parasitic capacitance and RC delay between the contact stacks 230 and the conductive gate stack 236. The conductive contact elements 228 in particular realize a significant reduction in RC delay due to the existence of the air gaps 232a-232b.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The invention claimed is:

1. A semiconductor device, comprising;
a semiconductor substrate;
a dielectric layer on an upper surface of the semiconductor substrate;
at least one contact stack formed in the dielectric layer, the at least one contact stack including an electrically conductive contact element and a contact liner on first and second opposing sidewalls of the contact element; and
a first air gap spacer interposed between the dielectric layer and the contact liner on the first side wall, and a second air gap spacer interposed between the dielectric layer and the contact liner on the second side wall, the first and second air gap spacers located in respective etched gaps defined by a previous existing sacrificial portion,
wherein each width of the first and second air gap spacers is greater than both a width of the contact liner and a width of the gap defined by the previous existing sacrificial portion prior to being etched.

2. The semiconductor device of claim 1, wherein the contact liner comprises titanium.

3. The semiconductor device of claim 2, wherein the contact element comprises a metal.

4. The semiconductor device of claim 3, wherein the contact element comprises tungsten.

5. The semiconductor device of claim 2, wherein the at least one least one contact stack includes a plurality of contact stacks, each contact stack separated from one another by a portion of the dielectric layer.

6. The semiconductor device of claim 5, wherein the plurality of contact stacks includes a first contact stack having a first side wall and an opposing second side wall, a first adjacent contact stack located adjacent the first side wall, and a second adjacent contact stack located adjacent the second side wall.

7. The semiconductor device of claim 6, wherein a first portion of the dielectric layer is interposed between the first adjacent contact stack and the first side wall, and wherein a second portion of dielectric layer is interposed between the second adjacent contact stack and the second side wall.

8. The semiconductor device of claim 7, wherein the first contact stack includes a first air gap spacer interposed between the first side wall and the first dielectric portion, and a second air gap spacer interposed between the second side wall and the second dielectric portion.

9. A fin-type field effect transistor (finFET) comprising:
a dielectric layer on an upper surface of a semiconductor fin;
first and second contact stacks in the dielectric layer, the first and second contact stacks each including a contact element formed between an opposing pair of contact liners; and
a gate stack in the dialectic layer and between first and second contact stacks,
wherein the first and second contact stacks each include a self-aligned air gap spacer interposed between the contact liners and the gate stack, the self-aligned air gap spacer located in an etched gap defined by a previous existing sacrificial portion, and
wherein a width of the self-aligned air gap spacer is greater than a width of the gap defined by the previous existing sacrificial portion before being etched.

10. The finFET of claim 9, wherein a thickness of the air gap spacers is greater than 1.5 nm.

11. The finFET of claim 9, wherein the contact element comprises a metal.

12. The finFET device of claim 11, wherein the contact element comprises tungsten.

13. The finFET device of claim 9, wherein the contact liners comprise a first set of contact liners including a first contact liner against a first side wall of the contact element corresponding to the first contact stack and a second contact liner against an opposing second side wall of the contact element corresponding to the first contact stack, and wherein the contact liners comprise a second set of contact liners including a first contact liner against a first side wall of the contact element corresponding to the second contact stack, and a second contact liner against an opposing second side wall of the contact element corresponding to the second contact stack.

14. The finFET device of claim 13, wherein the gate stack comprises:
a conductive gate element; and
a first gate spacer formed on a first side wall of the conductive gate element and a second gate spacer formed on a second side wall of the conductive gate element opposite the first side wall.

15. The finFET device of claim 14, wherein the self-aligned air gap spacer of the first contact stack is interposed between the second contact liner of the first contact stack and the first gate spacer, and wherein the self-aligned air gap spacer of the second contact stack is interposed between the second contact liner of the second contact stack and the second gate spacer.

* * * * *